(12) United States Patent
Taniguchi et al.

(10) Patent No.: US 9,531,342 B2
(45) Date of Patent: Dec. 27, 2016

(54) PIEZOELECTRIC THIN FILM RESONATOR, FILTER AND DUPLEXER

(71) Applicant: TAIYO YUDEN CO., LTD., Tokyo (JP)

(72) Inventors: Shinji Taniguchi, Tokyo (JP); Tokihiro Nishihara, Tokyo (JP); Tsuyoshi Yokoyama, Tokyo (JP); Takeshi Sakashita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 20 days.

(21) Appl. No.: 14/599,364

(22) Filed: Jan. 16, 2015

(65) Prior Publication Data
US 2015/0207490 A1 Jul. 23, 2015

(30) Foreign Application Priority Data
Jan. 23, 2014 (JP) ................................. 2014-010791

(51) Int. Cl.
| | | |
|---|---|---|
| *H03H 9/70* | (2006.01) | |
| *H03H 9/17* | (2006.01) | |
| *H03H 9/56* | (2006.01) | |
| *H03H 9/02* | (2006.01) | |
| *H03H 3/04* | (2006.01) | |

(52) U.S. Cl.
CPC ............. *H03H 9/173* (2013.01); *H03H 9/175* (2013.01); *H03H 9/568* (2013.01); *H03H 9/706* (2013.01); *H03H 2003/0407* (2013.01)

(58) Field of Classification Search
CPC ............ H03H 9/02157; H03H 9/02102; H03H 9/02118; H03H 9/131; H03H 9/132; H03H 9/173

USPC ........ 333/133, 187, 189, 191; 310/320, 346, 310/369
See application file for complete search history.

(56) References Cited

U.S. PATENT DOCUMENTS

| | | | | |
|---|---|---|---|---|
| 4,456,850 A | * | 6/1984 | Inoue ................. | H03H 9/02102 310/324 |
| 8,084,919 B2 | * | 12/2011 | Nishihara .......... | H03H 9/02118 310/320 |
| 2012/0146744 A1 | * | 6/2012 | Nishihara ................ | H03H 3/02 333/189 |

(Continued)

FOREIGN PATENT DOCUMENTS

JP 1-48694 B2 10/1989

OTHER PUBLICATIONS

Allah et al., "Temperature Compensated Solidly Mounted Resonators with thin SiO2 layers", Proc. IEEE Ultrasonics Symposium 2009, pp. 859-862 (Mentioned in paragraph No. 4 of the as-filed specification.).

*Primary Examiner* — Dean Takaoka
(74) *Attorney, Agent, or Firm* — Chen Yoshimura LLP

(57) ABSTRACT

A piezoelectric thin film resonator includes: a substrate; a piezoelectric film provided on the substrate; a lower electrode and an upper electrode that are opposed to each other to put at least a part of the piezoelectric film therebetween; and an insertion film that is inserted into the piezoelectric film in a resonance region where at least the part of the piezoelectric film is put between the lower electrode and the upper electrode, at least a part of the insertion film corresponding to an outer circumference region in the resonance region being thicker than a part of the insertion film corresponding to a central region in the resonance region.

10 Claims, 14 Drawing Sheets

(56) References Cited

U.S. PATENT DOCUMENTS

2013/0033337 A1* 2/2013 Nishihara .............. H03H 9/706
　　　　　　　　　　　　　　　　　　　　　　333/133
2013/0207515 A1* 8/2013 Taniguchi .......... H03H 9/02102
　　　　　　　　　　　　　　　　　　　　　　310/321

* cited by examiner

PIEZOELECTRIC THIN FILM RESONATOR, FILTER AND DUPLEXER

CROSS-REFERENCE TO RELATED APPLICATION

This application is based upon and claims the benefit of priority of the prior Japanese Patent Application No. 2014-010791, filed on Jan. 23, 2014, the entire contents of which are incorporated herein by reference.

FIELD

A certain aspect of the present invention relates to a piezoelectric thin film resonator, a filter and a duplexer, e.g. to a piezoelectric thin film resonator, a filter and a duplexer which include an insertion film in the piezoelectric film.

BACKGROUND

An acoustic wave device using a piezoelectric thin film resonator is used for a filter and a duplexer of a wireless device, such as a cellular phone, for example. The piezoelectric film resonator has the structure that a lower electrode and an upper electrode are opposite so as to put a piezoelectric film therebetween.

For example, there are a filter and a duplexer as the acoustic wave device using the piezoelectric thin film resonator. In these acoustic wave devices, a resonance frequency, an anti-resonance frequency or a frequency of a pass band changes by a temperature. There has been known a technique in which a temperature compensation film is provided in a piezoelectric film, as a technique to compensate for the temperature change (e.g. Japanese Patent Application Publication No. 1-48694, and Proc. IEEE Ultrasonics Symposium 2009, pp 859-862)

However, when the temperature compensator film is provided in the piezoelectric film, a resonance characteristic, such as a Q-value and/or an electromechanical coupling coefficient, decreases. When the Q-value decreases, for example, a steep skirt characteristic of the filter and the duplexer decreases.

SUMMARY OF THE INVENTION

According to an aspect of the present invention, there is provided a piezoelectric thin film resonator including: a substrate; a piezoelectric film provided on the substrate; a lower electrode and an upper electrode that are opposed to each other to put at least a part of the piezoelectric film therebetween; and an insertion film that is inserted into the piezoelectric film in a resonance region where at least the part of the piezoelectric film is put between the lower electrode and the upper electrode, at least a part of the insertion film corresponding to an outer circumference region in the resonance region being thicker than a part of the insertion film corresponding to a central region in the resonance region.

DETAILED DESCRIPTION

Hereinafter, a description will be given of embodiments of the present invention.

First Embodiment

Figure 1A:
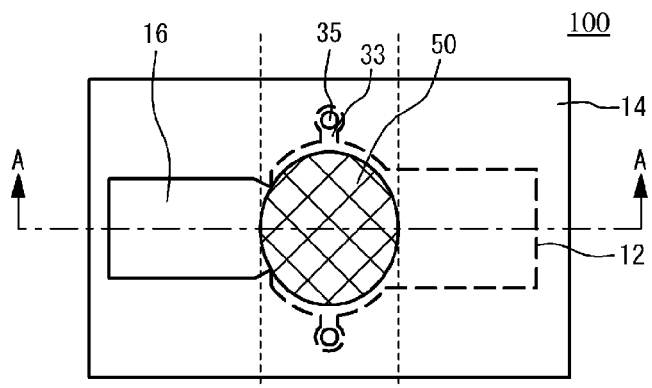
FIG. 1A is a plain view of a piezoelectric thin film resonator according to a first embodiment.
Figure 1B:
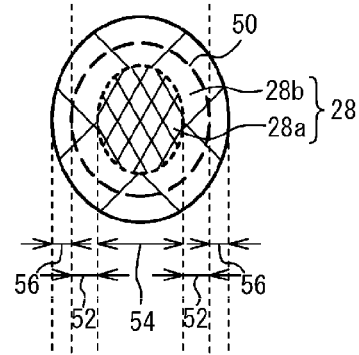
FIG. 1B is a plain view of an insertion film.
Figure 1C:
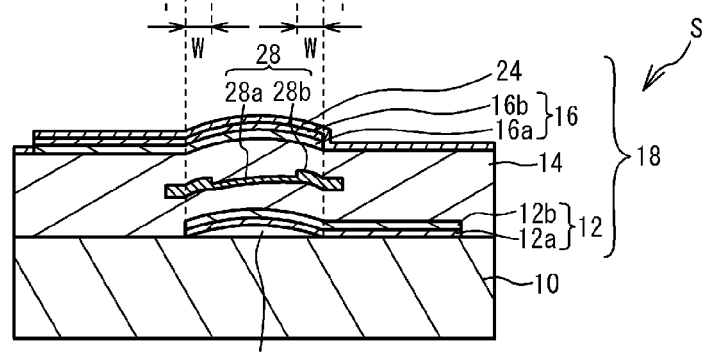
FIGS. 1C and 1D are cross-section diagrams taken along a line A-A of FIG. 1A.
Figure 1D:
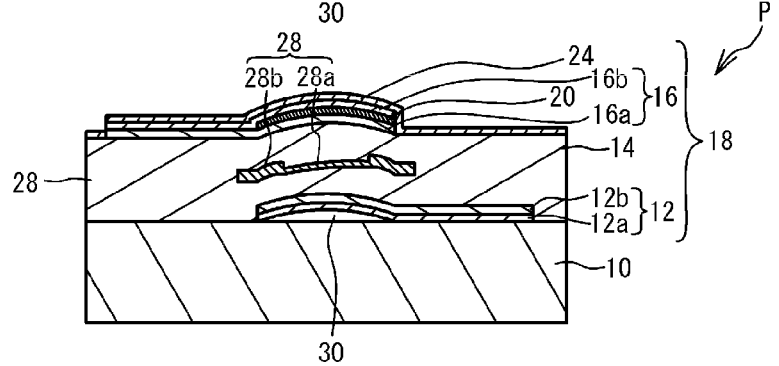

FIG. 1A is a plain view of a piezoelectric thin film resonator 100 according to a first embodiment. FIG. 1B is a plain view of an insertion film. FIGS. 1C and 1D are cross-section diagrams taken along a line A-A of FIG. 1A. FIG. 1C illustrates a cross-section surface of a series resonator of a ladder type filter, for example. FIG. 1D illustrates a cross-section surface of a parallel resonator of the ladder type filter, for example.

A description will be given of structure of a series resonator S with reference to FIGS. 1A and 1C. A lower electrode 12 is provided on a substrate 10 which is a silicon (Si) substrate. A space 30 with a domy bulge is formed between a flat principal surface of the substrate 10 and the lower electrode 12. The domy bulge is a bulge in which the height of the space 30 is low near an outer peripheral part of the space 30 and the height of the space 30 increases at closer distances to a center of the space 30. The lower electrode 12 includes a lower layer 12a and an upper layer 12b. The lower layer 12a is a Cr (chrome) film, for example. The upper layer 12b is a Ru (ruthenium) film, for example.

A piezoelectric film 14 composed mainly of aluminum nitride (AlN) having a principal axis in a (002) direction is provided on the lower electrode 12. An insertion film 28 is provided in the piezoelectric film 14 inside a resonance region 50. The insertion film 28 is provided in the center of a film thickness direction of the piezoelectric film 14. The insertion film 28 does not have to be provided in the center of the film thickness direction. However, when the insertion film 28 is provided in the center of the film thickness direction of the piezoelectric film 14, a function as the insertion film is greatly exhibited.

The insertion film 28 includes a thin film part 28a and a thick film part 28b. The thick film part 28b is thicker than the thin film part 28a. The thin film part 28a is provided in a central region 54 of the resonance region 50. The thick film part 28b is provided in at least a part of an outer circumference region 52 inside the resonance region 50. The thin film part 28a and the thick film part 28b are formed continuously. The outer circumference region 52 is a region which is inside the resonance region 50, includes the outer circumference of the resonance region 50 and is along the outer circumference of the resonance region 50. The outer circumference region 52 has a ring shape or a band shape (e.g. a shape in which a part of the ring shape is cut), for example. The central region 54 is a region which is inside the resonance region 50 and includes a center of the resonance region 50. The center does not have to be a geometrical center. The insertion film 28 is provided in the outer circumference region 52 and a region 56 surrounding the resonance region 50. The insertion film 28 is continuously provided from the outer circumference region 52 to the outside of the resonance region 50.

An upper electrode 16 is provided on the piezoelectric film 14 so as to include a region (i.e., the resonance region 50) opposed to the lower electrode 12 via the piezoelectric film 14. The resonance region 50 has an elliptical shape and is a region where an acoustic wave of a thickness longitudinal vibration mode resonates. The upper electrode 16 includes a lower layer 16a and an upper layer 16b. The lower layer 16a is the Ru film, for example. The upper layer 16b is the Cr film, for example.

On the upper electrode 16, a silicon oxide film is formed as a frequency adjustment film 24. A multilayered film 18 in the resonance region 50 includes the lower electrode 12, the piezoelectric film 14, the insertion film 28, the upper electrode 16 and the frequency adjustment film 24. The frequency adjustment film 24 may function as a passivation film.

As illustrated in FIG. 1A, an introduction path 33 for etching a sacrifice layer is formed on the lower electrode 12. The sacrifice layer is a layer for forming the space 30. The neighborhood of a tip of the introduction path 33 is not covered with the piezoelectric film 14, and the lower electrode 12 has a hole part 35 on the tip of the introduction path 33.

A description will be given of the structure of a parallel resonator P with reference to FIGS. 1A and 1D. Compared with the series resonator S, a mass loading film 20 is provided between the lower layer 16a and the upper layer 16b of the upper electrode 16. The mass loading film 20 is a Ti (titanium) film, for example. Therefore, the multilayered film 18 includes the mass loading film 20 formed on the entire surface in the resonance region 50, in addition to the multilayered film of the series resonator S. Since the other configuration is the same as corresponding configuration of the series resonator S of FIG. 1C, a description thereof is omitted.

A difference between the resonance frequencies of the series resonator S and the parallel resonator P is adjusted using a film thickness of the mass loading film 20. The adjustment of both of the resonance frequencies of the series resonator S and the parallel resonator P is performed by the adjustment of a film thickness of the frequency adjustment film 24.

When the piezoelectric thin film resonator has a resonance frequency of 1.7 GHz and a temperature characteristic of the resonance frequency is −10 ppm/° C., the lower layer 12a of the lower electrode 12 is the Cr film and the film thickness of the lower layer 12a is 100 nm. The upper layer 12b of the lower electrode 12 is the Ru film and the film thickness of the upper layer 12b is 200 nm. The piezoelectric film 14 is the AlN film and the film thickness of the piezoelectric film 14 is 1260 nm. The insertion film 28 is the silicon oxide ($SiO_2$) film, the film thickness of the thin film part 28a is 90 nm, and the film thickness of the thick film part 28b is 240 nm. The lower layer 16a of the upper electrode 16 is the Ru film and the film thickness of the lower layer 16a is 230 nm. The upper layer 16b of the upper electrode 16 is the Cr film and the film thickness of the upper layer 16b is 50 nm. The frequency adjustment film 24 is the silicon oxide film and the film thickness of the frequency adjustment film 24 is 50 nm. The mass loading film 20 is the Ti film and the film thickness of the mass loading film 20 is 120 nm. To get desired resonance characteristics, the film thickness of each layer can be set properly.

A quartz substrate, a glass substrate, a ceramic substrate, a GaAs substrate or the like can be used as the substrate 10 in addition to a Si substrate. A single layer film, such as Al (aluminum), Ti, Cu (copper), Mo (the molybdenum), W (tungsten), Ta (tantalum), Pt (platinum), Rh (rhodium), Ir (iridium) or the like, or a multilayered film including a plurality of single layer films can be used as each of the lower electrode 12 and the upper electrode 16. For example, the lower layer 16a of the upper electrode 16 may be the Ru film, and the upper layer 16b may be the Mo film. ZnO (zinc oxide), PZT (lead zirconate titanate), PbTiO3 (lead titanic) or the like can be used as the piezoelectric film 14 in addition to the aluminum nitride. For example, the piezoelectric film 14 contains the aluminum nitride as a main component, and may contain other elements for improvement of the resonance characteristics or improvement of piezoelectricity. Since the piezoelectricity of the piezoelectric film 14 improves by using Sc (scandium) as an additional element, for example, the effective electromechanical coupling coefficient of the piezoelectric thin film resonator can be improved.

The thin film part 28a of the insertion film 28 has a temperature coefficient of an elastic constant having a code reverse to a code of the temperature coefficient of the elastic constant of the piezoelectric film 14. Thereby, the temperature coefficient of the resonance frequency or the like can be made close to 0. An insulation film, such as a silicon oxide film or a silicon nitride film, can be used as the thin film part 28a, for example. The thick film part 28b of the insertion film 28 includes a film composed of a material having a small Young's modulus, compared with the piezoelectric film 14. A detailed description thereof is explained later.

A silicon nitride film or an aluminum nitride film can be used as the frequency adjustment film 24 in addition to the silicon oxide film. The single layer film, such as Ru, Cr, Al, Cu, Mo, W, Ta, Pt, Rh, or Ir, can be used as the mass loading film 20 in addition to Ti. Moreover, an insulation film composed of a metal nitride or a metal oxide, such as silicon nitride or silicon oxide, can be used as the mass loading film 20. The mass loading film 20 can be formed under the lower electrode 12, between the layers of the lower electrode 12, on the upper electrode 16, between the lower electrode 12 and the piezoelectric film 14, or between the piezoelectric film 14 and the upper electrode 16, in addition to between the layers of the upper electrode 16. As long as the mass loading film 20 is formed so as to include the resonance region 50, the mass loading film 20 may be larger than the resonance region 50.

Figure 2A:
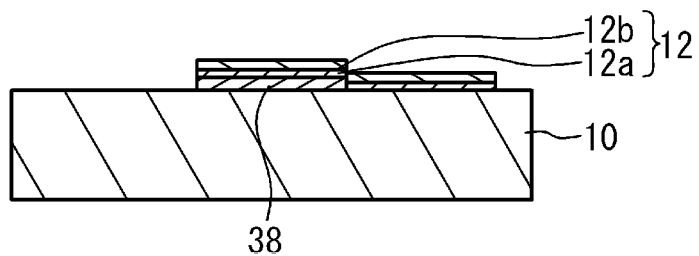
FIGS. 2A to 2C are cross-section diagrams illustrating a manufacturing method of a series resonator according to the first embodiment.
Figure 2B:
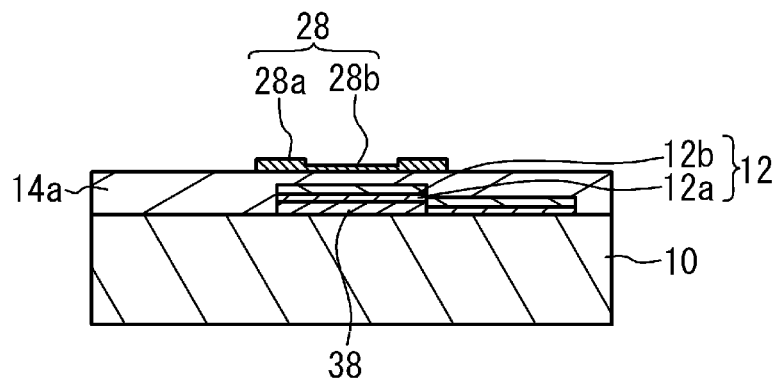
Figure 2C:
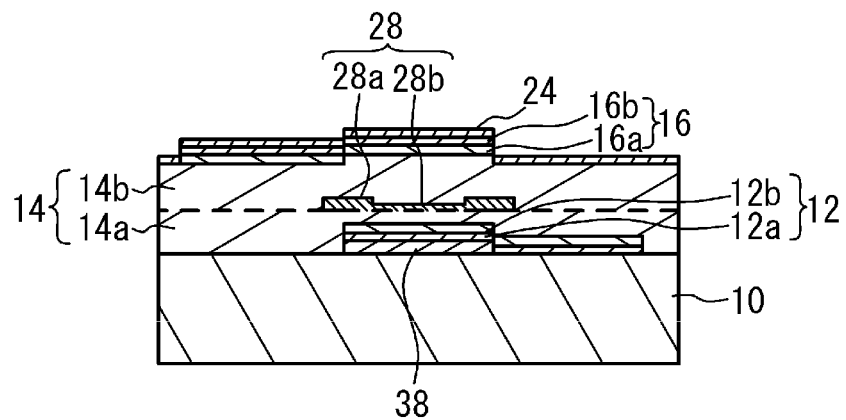

FIGS. 2A to 2C are cross-section diagrams illustrating a manufacturing method of the series resonator according to the first embodiment. As illustrated in FIG. 2A, a sacrifice layer 38 for forming a space on the substrate 10 having a flat principle surface is formed. The film thickness of the sacrifice layer 38 is 10 to 100 nm, for example. The sacrifice layer 38 is selected from materials which can be easily dissolved in an etching liquid or an etching gas, such as MgO, ZnO, Ge, or $SiO_2$. Then, the sacrifice layer 38 is patterned after a desired shape using a photolithography technique and an etching technique. The sacrifice layer 38 has a shape corresponding to a planar shape of the space 30, and includes a region which becomes the resonance region 50, for example. Next, the lower layer 12 and the upper layer 12b as the lower electrode 12 are formed on the sacrifice layer 38 and the substrate 10. The sacrifice layer 38 and the lower electrode 12 are formed using a sputtering method, a vacuum deposition method or a CVD (Chemical Vapor Deposition) method, for example. Then, the lower electrode 12 is patterned after a desired shape using the photolithography technique and the etching technique. The lower electrode 12 may be formed using a lift-off method.

As illustrated in FIG. 2B, a lower piezoelectric film 14a and the insertion film 28 are formed on the lower electrode 12 and the substrate 10 using the sputtering method, the vacuum deposition method or the CVD method, for example. The insertion film 28 is patterned after a desired shape using the photolithography technique and the etching technique. The insertion film 28 may be formed using the lift-off method. The insertion film 28 is formed such that the thick film part 28b becomes thicker than the thin film part 28a.

As illustrated in FIG. 2C, an upper piezoelectric film 14b, and the lower layer 16a and the upper layer 16b of the upper electrode 16 are formed using the sputtering method, the vacuum deposition method or the CVD method, for example. The piezoelectric film 14 is formed from the lower piezoelectric film 14a and the upper piezoelectric film 14b. The upper electrode 16 is patterned after a desired shape using the photolithography technique and the etching technique. The upper electrode 16 may be formed using the lift-off method.

Here, in the parallel resonator illustrated in FIG. 1D, the lower layer 16a of the upper electrode 16 is formed, and then the mass loading film 20 is formed using the sputtering method, the vacuum deposition method or the CVD method, for example. The mass loading film 20 is patterned after a desired shape using the photolithography technique and the etching technique. Then, the upper layer 16b of the upper electrode 16 is formed.

The frequency adjustment film 24 is formed using the sputtering method or the CVD method, for example. The frequency adjustment film 24 is patterned after a desired shape using the photolithography technique and the etching technique.

Then, the etching liquid in the sacrifice layer 38 is introduced into the sacrifice layer 38 under the lower electrode 12 through the hole part 35 and the introduction path 33 (see FIG. 1A). Thereby, the sacrifice layer 38 is eliminated. It is desirable that a medium etching the sacrifice layer 38 does not etch the materials constituting the resonator other than the sacrifice layer 38. Especially, it is desirable that an etching medium is a medium in which the lower electrode 12 touching the etching medium is not etched. A stress of the multilayered film 18 is set to become a compressive stress (see FIGS. 1C and 1D). Thereby, when the sacrifice layer 38 is eliminated, the multilayered film 18 bulges toward an opposite side of the substrate 10 so as to be separated from the substrate 10. The space 30 with the domy bulge is formed between the lower electrode 12 and the substrate 10. As described above, the series resonator S illustrated in FIGS. 1A and 1C and the parallel resonator illustrated in FIGS. 1A and 1D are manufactured.

Figure 3A:
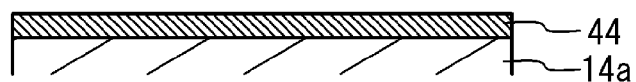
FIGS. 3A to 3G are cross-section diagrams illustrating a formation method of the insertion film according to the first embodiment.
Figure 3B:
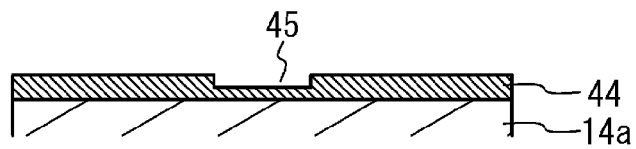
Figure 3C:
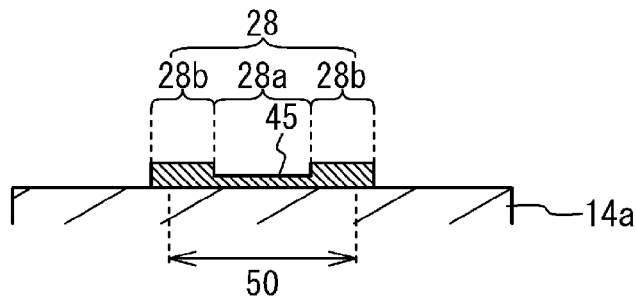

FIGS. 3A to 3G are cross-section diagrams illustrating a formation method of the insertion film according to the first embodiment. As illustrated in FIG. 3A, a film 44 which becomes the insertion film is formed on the lower piezoelectric film 14a. The film 44 is formed using the sputtering method, the vacuum deposition method or the CVD method, for example. As illustrated in FIG. 3B, a region of the film 44 which becomes the thin film part 28a located inside a region of the film 44 which becomes the resonance region 50 is thinned using the photolithography technique and the etching technique. Thereby, a concave portion 45 is formed on the film 44. As illustrated in FIG. 3C, the film 44 is patterned so as to become larger than the resonance region 50 using the photolithography technique and the etching technique. Thereby, the insertion film 28 is formed from the film 44. An region of the concave portion 45 becomes the thin film part 28a and a region other than the concave portion 45 becomes the thick film part 28b.

Figure 3D:
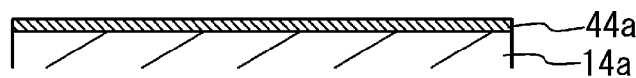
Figure 3E:
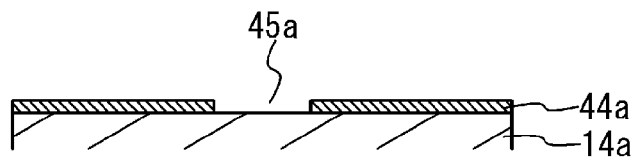
Figure 3F:
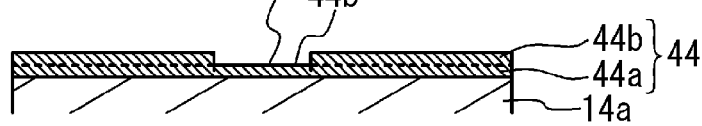
Figure 3G:
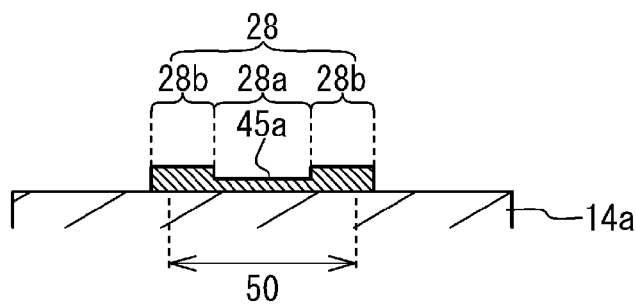

Next, a description will be given of another formation method of the insertion film 28. As illustrated in FIG. 3D, a lower film 44a of the insertion film is formed on the lower piezoelectric film 14a. The lower film 44a is formed using the sputtering method, the vacuum deposition method or the CVD method, for example. As illustrated in FIG. 3E, a region 45a which becomes the thin film part in the lower film 44a is eliminated using the photolithography technique and the etching technique. Thereby, an opening is formed on the lower film 44a. The lower film 44a having the opening may be formed using the lift-off method. As illustrated in FIG. 3F, an upper film 44b is formed on the lower film 44a and the opening. The upper film 44b is formed using the sputtering method, the vacuum deposition method or the CVD method, for example. The film 44 which becomes the insertion film is formed from the lower film 44a and the upper film 44b. As illustrated in FIG. 3G, the film 44 is patterned after a desired shape using the photolithography technique and the etching technique. Thereby, the insertion film 28 is formed from the film 44. The region 45a becomes the thin film part 28a and a region other than the region 45a becomes the thick film part 28b.

The formation method of the insertion film of FIGS. 3A to 3C can reduce manufacturing man-hours, compared with the formation method of the insertion film of FIGS. 3D to 3G. On the contrary, the formation method of the insertion film of FIGS. 3D to 3G can improve an accuracy of the film thickness of the thin film part 28a, compared with the formation method of the insertion film of FIGS. 3A to 3C. Moreover, in the formation method of the insertion film of FIGS. 3D to 3G, the materials of the lower film 44a and the upper film 44b can differ mutually. For example, a material which has a high Young's modulus, compared with the piezoelectric film 14, can be used as the lower film 44a, and a material which has the temperature coefficient of the elastic constant having a code reverse to a code of the temperature coefficient of the elastic constant of the piezoelectric film 14 can be used as the upper film 44b.

In order to confirm an effect that forms the thick film part 28b on the insertion film 28, the simulation is performed using a finite element method. The finite element method is performed by two-dimensional analysis of the cross surface like FIG. 1C. Each film thickness and each material of the insertion film 28 are the same as those used as the piezoelectric thin film resonator having the resonance frequency of 1.7 GHz in FIGS. 1A to 1D. That is, the AlN is used as the piezoelectric film 14. The insertion film 28 is set to the silicon oxide film. The film thickness of the thin film part 28a is set to 90 nm, and the film thickness of the thick film part 28b is set to 240 nm. An overlapping width W of the resonance region 50 and the thick film part 28b is set to 0 μm, 3 μm, 4 μm or 5 μm. A comparative example 1 indicates that the width W is 0 μm. In the comparative example 1, the insertion film 28 does not include the thick film part 28b, and the insertion film 28 is configured by only the thin film part 28a. The insertion film 28 is provided at an intermediate position in a direction of the film thickness of the piezoelectric film 14.

FIGS. 4A to 4D are diagrams illustrating simulation results of a Q-value Qr of a resonant frequency to the width W, a Q-value Qa of an anti-resonant frequency to the width W, an effective electromechanical coupling coefficient Keff² to the width W, and a FOM (Figure Of Merit) to the width W, respectively, according to the first embodiment and the comparative example 1. The FOM is led from the effective electromechanical coupling coefficient Keff²×√ (the Q-value Qr of the resonant frequency x the Q-value Qa of the anti-resonant frequency).

Figure 4A:
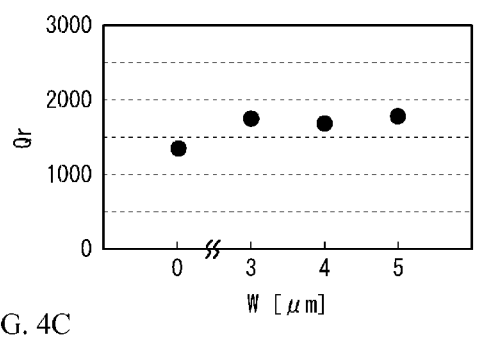
FIGS. 4A to 4D are diagrams illustrating simulation results of a Q-value Qr of a resonant frequency to a width W, a Q-value Qa of an anti-resonant frequency to the width W, an effective electromechanical coupling coefficient $Keff^2$ to the width W, and a FOM (Figure Of Merit) to the width W, respectively, according to the first embodiment and a comparative example 1.
Figure 4B:
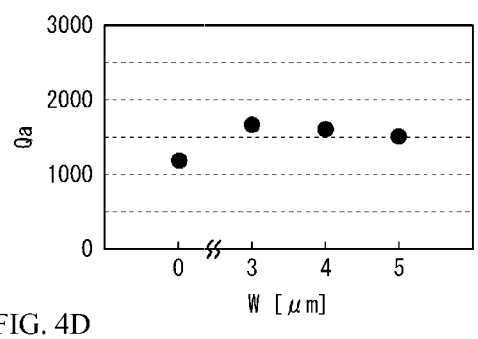

As illustrated in FIGS. 4A and 4B, the Q-values of the resonant frequency and the anti-resonant frequency improve by forming the thick film part 28b. This is because of the following reason. That is, the thick film part 28b having a small Young's modulus is provided on the outer circumference region 52, so that vibration of the acoustic wave becomes small in the outer circumference region 52 of the resonance region 50. Thereby, the outer circumference of the resonance region 50 functions as a fixed end, and the acoustic wave performs a fixed end reflection. Therefore, the outer circumference region 52 prevents the energy of the acoustic wave from leaking outside the resonance region 50. Thereby, the Q-value becomes large.

Figure 4C:
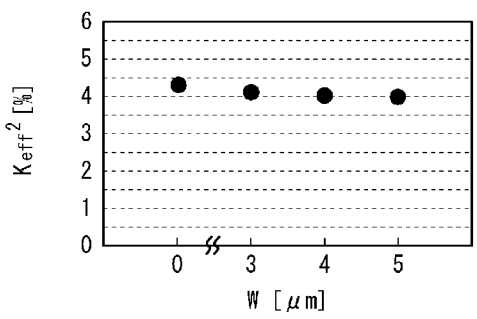
Figure 4D:
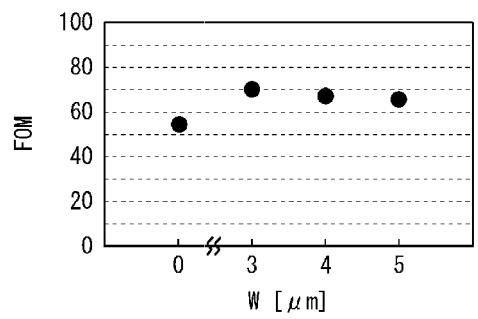

As illustrated in FIG. 4C, the effective electromechanical coupling coefficient decreases by forming the thick film part 28b. However, as illustrated in FIG. 4D, the FOM improves by forming the thick film part 28b. Thus, the thick film part 28b is formed on the outer circumference region 52, so that the Q-value and the FOM can be improved.

Second Embodiment

Figure 5A:
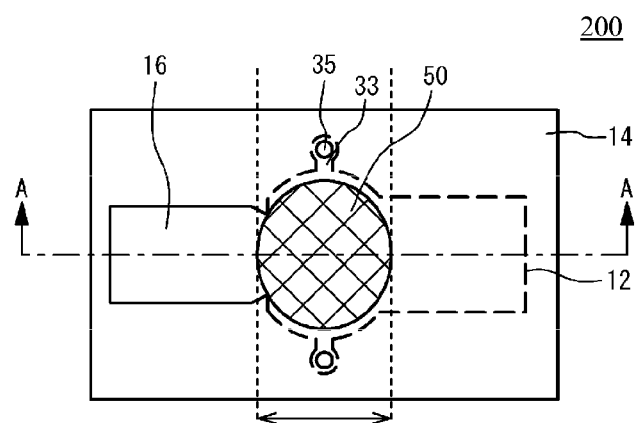
FIG. 5A is a plain view of a piezoelectric thin film resonator according to a second embodiment.
Figure 5B:
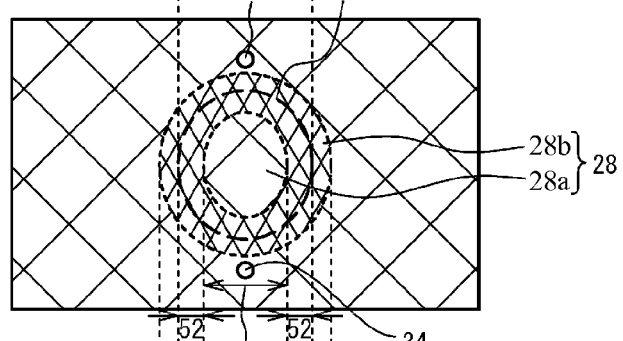
FIG. 5B is a plain view of an insertion film.
Figure 5C:
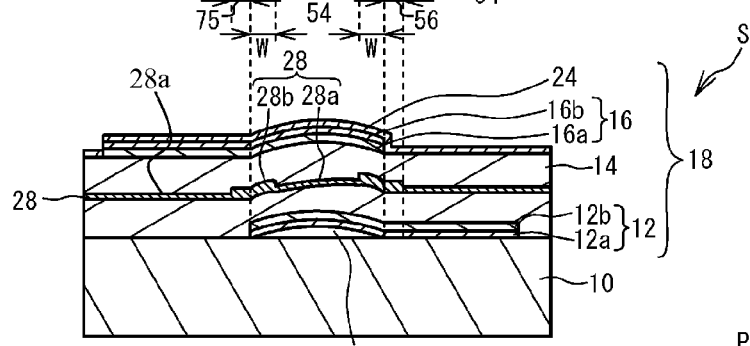
FIGS. 5C and 5D are cross-section diagrams taken along a line A-A of FIG. 5A.
Figure 5D:
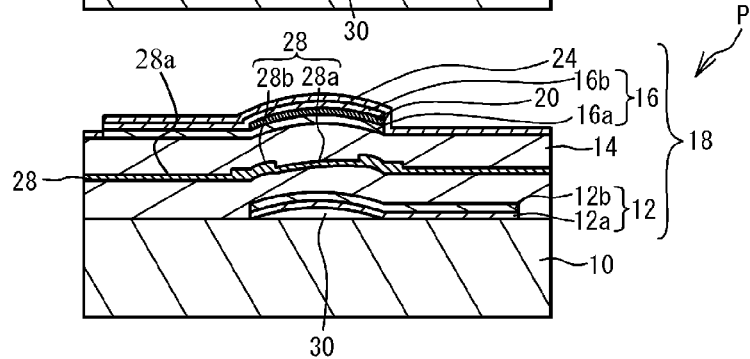

FIG. 5A is a plain view of a piezoelectric thin film resonator 200 according to a second embodiment. FIG. 5B is a plain view of an insertion film. FIGS. 5C and 5D are cross-section diagrams taken along a line A-A of FIG. 5A. FIG. 5C illustrates a cross-section surface of a series resonator of a ladder type filter, for example. FIG. 5D illustrates a cross-section surface of a parallel resonator of the ladder type filter, for example.

As illustrated in FIGS. 5A to 5D, the thin film part 28a is formed outside the thick film part 28b of the insertion film 28. Thus, the insertion film 28 is formed continuously outside the resonance region 50. A hole 34 which communicates with a hole part 35 is formed on the insertion film 28. Since the other configuration is the same as corresponding configuration of FIGS. 1A to 1D according to the first embodiment, a description thereof is omitted.

Figure 6A:
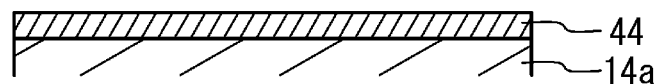
FIGS. 6A to 6E are cross-section diagrams illustrating a formation method of the insertion film according to the second embodiment.
Figure 6B:
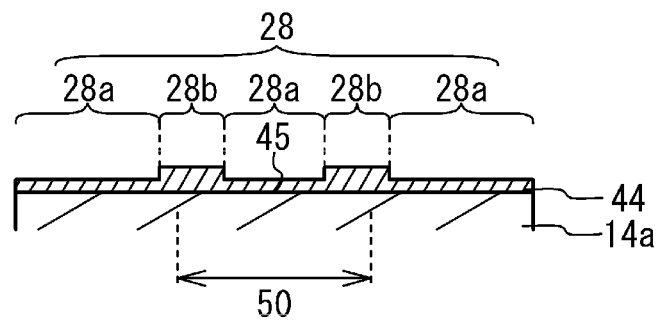

FIGS. 6A to 6E are cross-section diagrams illustrating a formation method of the insertion film according to the second embodiment. As illustrated in FIG. 6A, the film 44 which becomes the insertion film is formed on the lower piezoelectric film 14a. As illustrated in FIG. 6B, regions which become the thin film parts 28a located inside and outside a region which becomes the resonance region 50 are thinned in the film 44. Thereby, the concave portion 45 is formed on the film 44. The concave portion 45 becomes the thin film parts 28a and a part other than the concave portion 45 becomes the thick film part 28b.

Figure 6C:
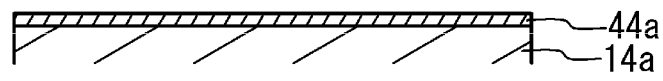
Figure 6D:
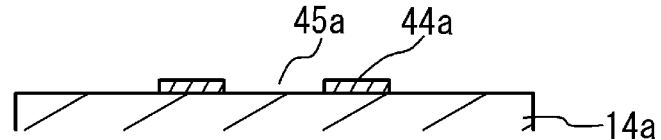
Figure 6E:
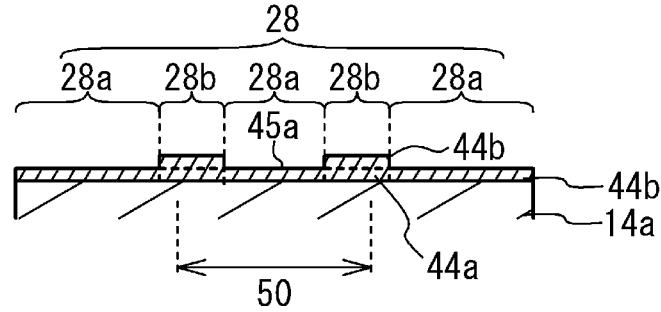

Next, a description will be given of another formation method of the insertion film 28. As illustrated in FIG. 6C, the lower film 44a of the insertion film is formed on the lower piezoelectric film 14a. As illustrated in FIG. 6D, the region 45a which becomes the thin film part 28a is eliminated from the lower film 44a. As illustrated in FIG. 6E, the upper film 44b is formed on the lower film 44a and the lower piezoelectric film 14a. The film 44 which becomes the insertion film 28 is formed from the lower film 44a and the upper film 44b. The region 45a becomes the thin film part 28a and a region other than the region 45a becomes the thick film part 28b. Since the other formation method of the insertion film 28 is the same as that of the first embodiment, a description thereof is omitted.

Figure 7A:
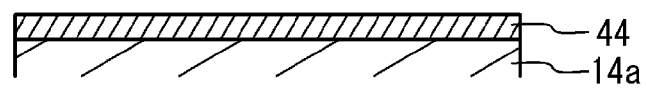
FIGS. 7A to 7E are cross-section diagrams illustrating a formation method of another insertion film.
Figure 7B:
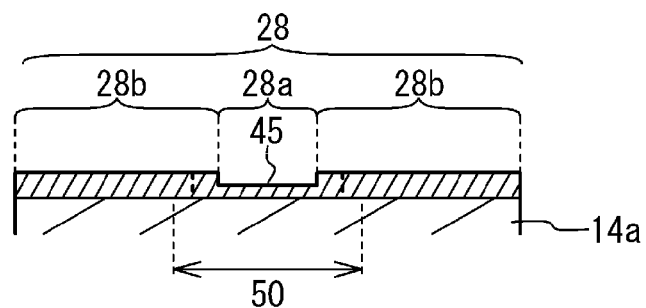

FIGS. 7A to 7E are cross-section diagrams illustrating a formation method of another insertion film. As illustrated in FIG. 7A, the film 44 which becomes the insertion film 28 is formed on the lower piezoelectric film 14a. As illustrated in FIG. 7B, a region which becomes the thin film part 28a located inside a region which becomes the resonance region 50 is thinned in the film 44. The outside of the resonance region 50 is not thinned in the film 44. Thereby, the concave portion 45 is formed on the film 44. The concave portion 45 becomes the thin film part 28a and a region other than the concave portion 45 becomes the thick film part 28b.

Figure 7C:
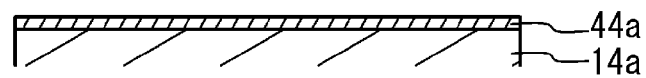
Figure 7D:
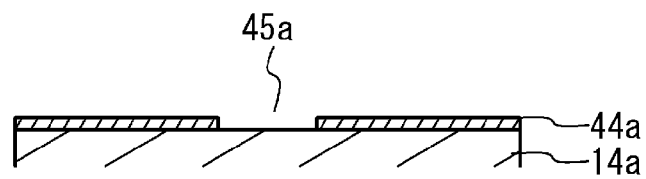
Figure 7E:
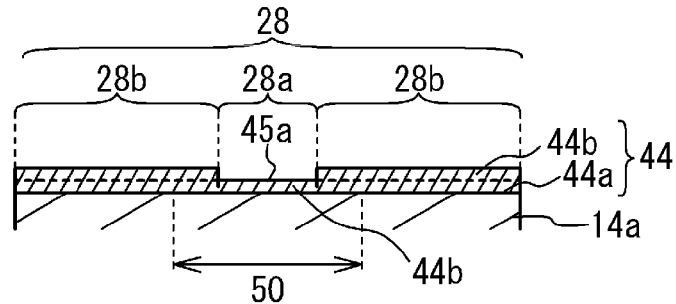
Figure 8A:
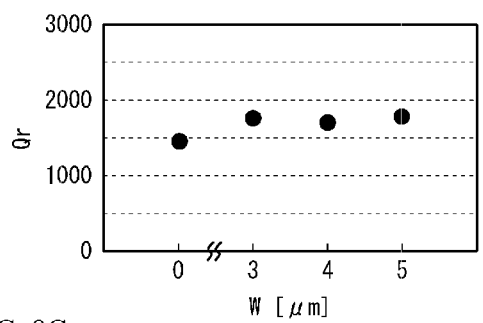
FIGS. 8A to 8D are diagrams illustrating simulation results of a Q-value Qr of a resonant frequency to a width W, a Q-value Qa of an anti-resonant frequency to the width W, an effective electromechanical coupling coefficient $Keff^2$ to the width W, and a FOM (Figure Of Merit) to the width W, respectively, according to the second embodiment and a comparative example 2.
Figure 8B:
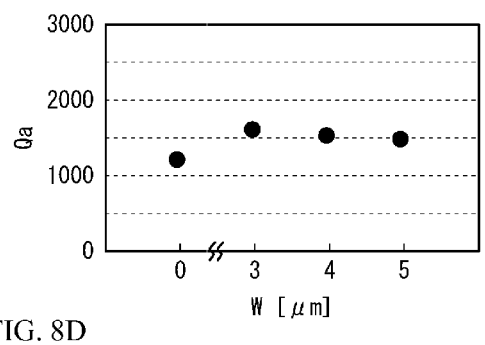
Figure 8C:
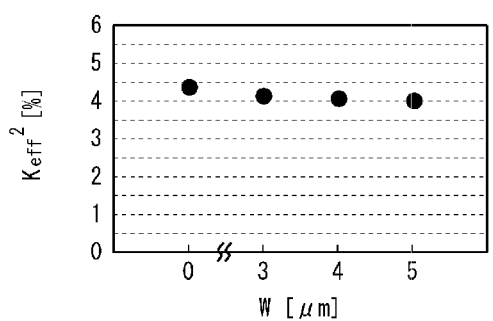
Figure 8D:
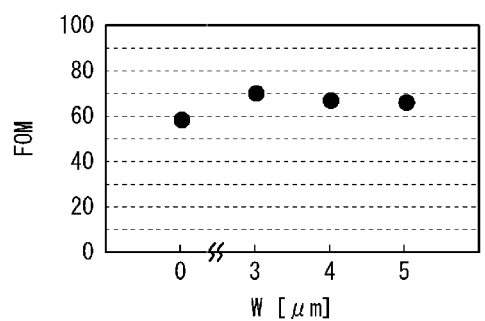

Next, a description will be given of the other formation method of the insertion film 28. As illustrated in FIG. 7C, the lower film 44a of the insertion film 28 is formed on the lower piezoelectric film 14a. As illustrated in FIG. 7D, the region 45a which becomes the thin film part 28a is eliminated from the lower film 44a. As illustrated in FIG. 7E, the upper film 44b is formed on the lower film 44a and the lower piezoelectric film 14a. The film 44 which becomes the insertion film 28 is formed from the lower film 44a and the upper film 44b. The region 45a becomes the thin film part 28a and a region other than the region 45a becomes the thick film part 28b. Since the other formation method of the insertion film 28 is the same as that of the first embodiment, a description thereof is omitted.

As illustrated in FIGS. 7A to 7E, the thin film part 28a does not have to be provided outside the resonance region 50.

A simulation about the second embodiment is performed as with FIGS. 4A to 4D of the first embodiment. FIGS. 8A to 8D are diagrams illustrating simulation results of a Q-value Qr of a resonant frequency to a width W, a Q-value Qa of an anti-resonant frequency to the width W, an effective electromechanical coupling coefficient Keff$^2$ to the width W, and a FOM (Figure Of Merit) to the width W, respectively, according to the second embodiment and a comparative example 2. In the comparative example 2, the insertion film 28 does not include the thick film part 28b, and the insertion film 28 is configured by only the thin film part 28a.

As illustrated in FIGS. 8A to 8D, the effective electromechanical coupling coefficient decreases slightly by forming the thick film part 28b. The Q-values of the resonant frequency and the anti-resonant frequency and the FOM improve by forming the thick film part 28b. Thus, the thick film part 28b is formed on the outer circumference region 52, so that the Q-values and the FOM can be improved.

Figure 9A:
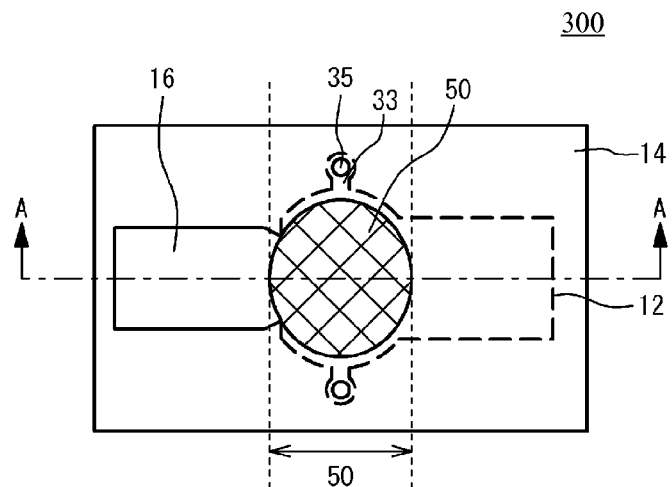
FIG. 9A is a plain view of a piezoelectric thin film resonator according to a comparative example 3.
Figure 9B:
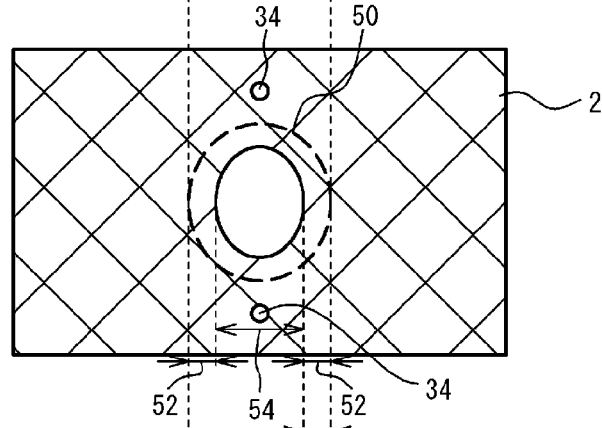
FIG. 9B is a plain view of an insertion film.
Figure 9C:
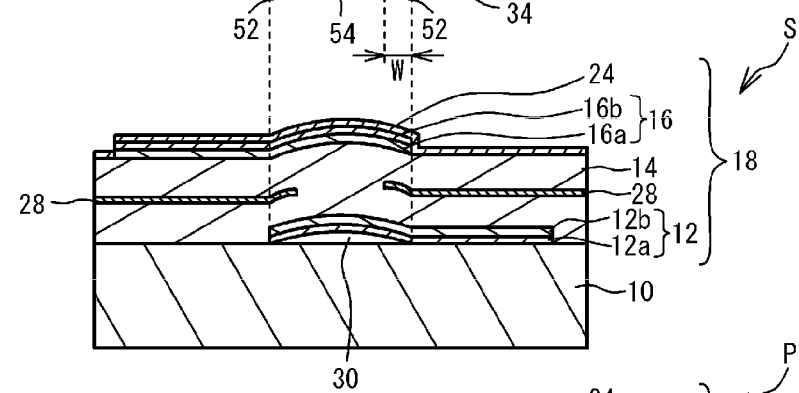
FIGS. 9C and 9D are cross-section diagrams taken along a line A-A of FIG. 9A.
Figure 9D:
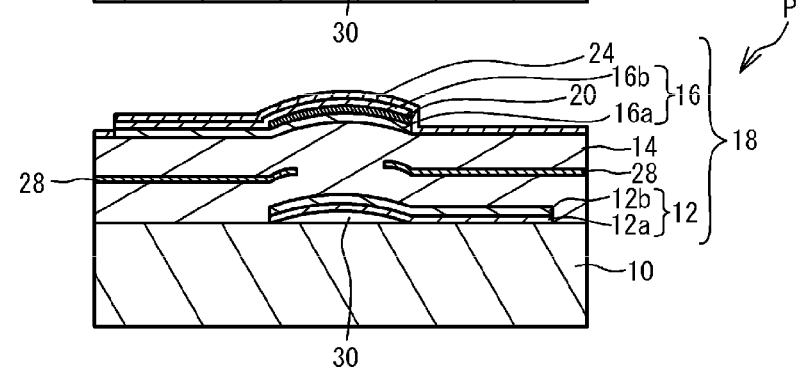

In order to examine a desirable material of the thick film part 28b, the simulation about a comparative example 3 in which the insertion film 28 is not formed on the central region 54 is performed. FIG. 9A is a plain view of a piezoelectric thin film resonator 300 according to the comparative example 3. FIG. 9B is a plain view of an insertion film. FIGS. 9C and 9D are cross-section diagrams taken along a line A-A of FIG. 9A.

As illustrated in FIGS. 9A to 9D, the insertion film 28 is not formed on the central region 54. The thick film part 28b is not formed on the insertion film 28, and the insertion film 28 has an uniform film thickness. Since the other configuration is the same as corresponding configuration of FIGS. 5A to 5D according to the second embodiment, a description thereof is omitted.

With respect to the comparative example 3, the material of the insertion film 28 is changed, and the simulation about the Q-value of the anti-resonant frequency is performed using the finite element method. The finite element method is performed by two-dimensional analysis of the cross surface like FIG. 9C. Each film thickness and each material of the multilayered film 18 are as follows.

The lower layer 12a of the lower electrode 12 is the Cr film, and the film thickness of the lower layer 12a is 100 nm. The upper layer 12b of the lower electrode 12 is the Ru film, and the film thickness of the upper layer 12b is 250 nm. The piezoelectric film 14 is the AlN film, and the film thickness of the piezoelectric film 14 is 1100 nm. Each of the film thicknesses of the lower piezoelectric film 14a and the upper piezoelectric film 14b is 550 nm. The lower layer 16a of the upper electrode 16 is the Ru film, and the film thickness of the lower layer 16a is 250 nm. The upper layer 16b of the upper electrode 16 is the Cr film, and the film thickness of the upper layer 16b is 50 nm. The frequency adjustment film 24 is the silicon oxide film, and the film thickness of the frequency adjustment film 24 is 50 nm. The film thickness of the insertion film 28 is set to 150 nm, and the overlapping width W of the resonance region 50 and the insertion film 28 is set to 2 μm. The insertion film 28 is provided at the intermediate position in the direction of the film thickness of the piezoelectric film 14.

Figure 10A:
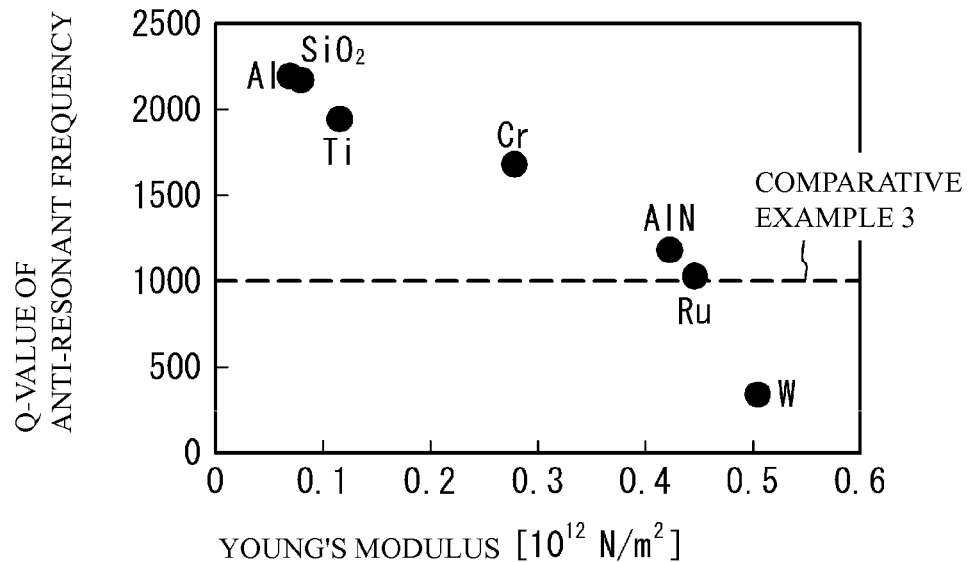
FIG. 10A is a diagram illustrating a Q-value of an anti-resonant frequency to a Young's modulus.
Figure 10B:
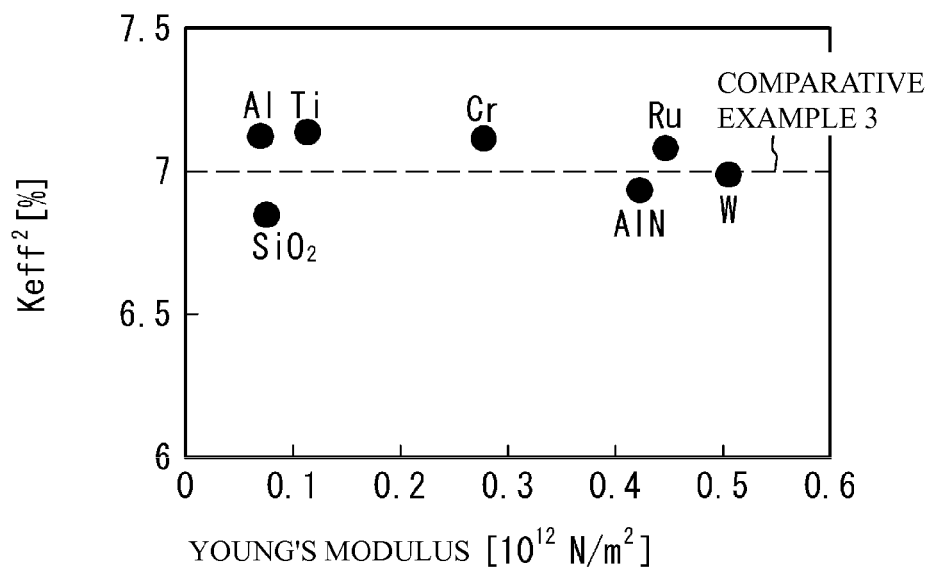
FIG. 10B is a diagram illustrating an effective electromechanical coupling coefficient $Keff^2$ to the Young's modulus.

FIG. 10A is a diagram illustrating a Q-value of an anti-resonant frequency to a Young's modulus. FIG. 10B is a diagram illustrating an effective electromechanical coupling coefficient Keff$^2$ to the Young's modulus. The comparative example 3 corresponds to a resonator which does not include the insertion film 28. The Q-value of the anti-resonant frequency and the effective electromechanical coupling coefficient Keff$^2$ about Al, SiO$_2$, Ti, Cr, AlN, Ru and W as the material of the insertion film 28 are calculated.

When the insertion film 28 is made of the material having a small Young's modulus with reference to FIG. 10A, the Q-value of the anti-resonant frequency becomes large. When the Young's modulus becomes smaller than the Young's modulus of the AlN, the Q-value of the anti-resonant frequency becomes larger than the Q-value of the comparative example 3. This is because the insertion film 28 of the outer circumference region 52 prevents the energy of the acoustic wave from leaking outside the resonance region 50.

When the insertion film 28 is made of metal with reference to FIG. 10B, the effective electromechanical coupling coefficient Keff$^2$ becomes large. It is presumed that the electric field distributions of the acoustic wave in the resonance region 50 are made uniform when the insertion film 28 is made of the metal.

According to the first embodiment and the second embodiment, the insertion film 28 is inserted into the piezoelectric film 14 in the resonance region 50, and the outer circumference region 52 in the resonance region 50 is thicker than the central region 54 in the resonance region 50. When the insertion film 28 is inserted into the piezoelectric film 14 in the resonance region 50, the temperature change of the resonance characteristics can be controlled. However, since the film which is not the piezoelectric film is inserted into the piezoelectric film 14, the resonance characteristics of the Q-value and the like deteriorate. Therefore, the insertion film 28 corresponding to the outer circumference region 52 is made thick. Thereby, the outer circumference region 52 can prevent the acoustic wave in the resonance region 50 from leaking outside the resonance region 50. Therefore, the resonance characteristics of the Q-value, the FOM and the like can be improved.

It is desirable that the temperature coefficient of an elastic constant of the insertion film 28 inside the central region 54 has a code reverse to a code of the temperature coefficient of the elastic constant of the piezoelectric film 14. Thereby, the temperature coefficient of the resonance characteristic can be made close to 0. The insertion film 28 inside the central region 54 (i.e., the thin film part 28a) can be set so that a temperature change of the resonance characteristic can be controlled.

Moreover, it is desirable that the insertion film 28 in the outer circumference region 52 (i.e., the thick film part 28b) includes a film having a Young's modulus smaller than the Young's modulus of the piezoelectric film 14. Thereby, as illustrated in FIGS. 4A to 4D and FIGS. 8A to 8D, the outer circumference region 52 prevents the acoustic wave from leaking outside the resonance region 50, and the deterioration of the resonance characteristic can be controlled.

It is desirable that the film having the Young's modulus smaller than the Young's modulus of the piezoelectric film 14 is made of Al, SiO$_2$, Ti, Cr, AlN, Ru or W, as illustrated in FIG. 10A. It is desirable that the Young's modulus of the film is equal to or less than 90% of the Young's modulus of the piezoelectric film 14, and it is more desirable that the Young's modulus of the film is equal to or less than 80% of the Young's modulus of the piezoelectric film 14.

It is desirable that the film having the small Young's modulus is the metal film in order to improve the effective electromechanical coupling coefficient, as illustrated in FIG. 10B. It is desirable that insertion film 28 is composed mainly of the silicon oxide in order to commonize the materials of the thin film part 28a and the thick film part 28b. Other elements other than the silicon oxide which is a main component may be included in the insertion film 28. For example, fluorine may be included for the improvement of the temperature characteristic.

In order not to deteriorate the resonance characteristic, it is desirable that the width W of the thick film part 28b in the resonance region 50 is 2.5 times or less the wavelength λ of the acoustic wave in case of the thickness longitudinal vibration of the piezoelectric thin film resonator, it is more desirable that the width W is 2.0 times or less the wavelength λ, and it is further more desirable that the width W is 1.4 times or less the wavelength λ. In addition, it is desirable that the width W is 0.3 times or more the wavelength λ.

In order not to deteriorate the resonance characteristic, it is desirable that the film thickness of the thick film part 28b in the resonance region 50 is 0.2 times or less the film thickness of the multilayered film in the central region 54 of the resonance region 50, it is more desirable that the film thickness of the thick film part 28b is 0.15 times or less the film thickness of the multilayered film, and it is further more desirable that the film thickness of the thick film part 28b is 0.1 times or less the film thickness of the multilayered film. It is desirable that the film thickness of the thick film part 28b is 0.03 times or more the film thickness of the multilayered film.

The insertion film 28 may be formed only inside the resonance region 50 and on the region 56 surrounding the resonance region 50, as with the first embodiment. The insertion film 28 may be formed inside the resonance region 50 and on the whole region other than the resonance region 50, as with the second embodiment. The film thickness of the insertion film 28 outside the resonance region 50 may be the same as that of the thin film part 28a or the thick film part 28b, or may be different from the film thicknesses of the thin film part 28a and the thick film part 28b. The insertion film 28 does not need to be provided outside the resonance region 50. The thick film part 28b may be provided on a part of the outer circumference region 52. It is desirable that the thick film part 28b is provided on almost all of the outer circumference region 52 in order to prevent the acoustic wave from leaking outside the resonance region 50. From a viewpoint of simplification of the manufacturing process, it is desirable that the film thickness of the thin film part 28a is constant and the film thickness of the thick film part 28b is constant. The film thickness of the thin film part 28a may be irregular and the film thickness of the thick film part 28b may be irregular.

Third Embodiment

Figure 11A:
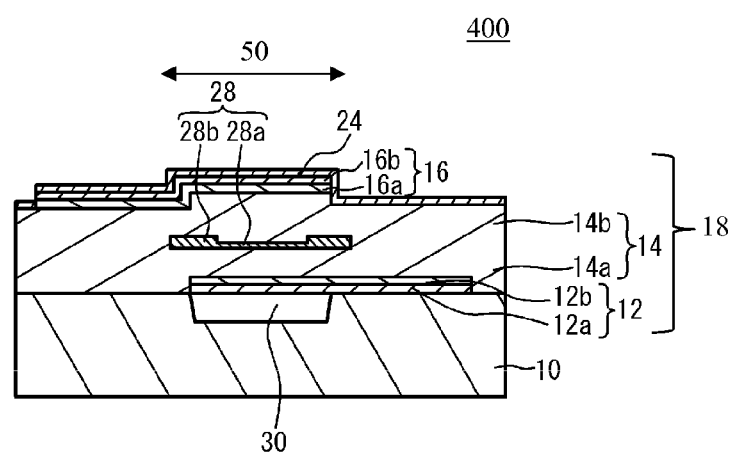
FIG. 11A is a cross-section diagram of the piezoelectric thin film resonator according to the third embodiment.
Figure 11B:
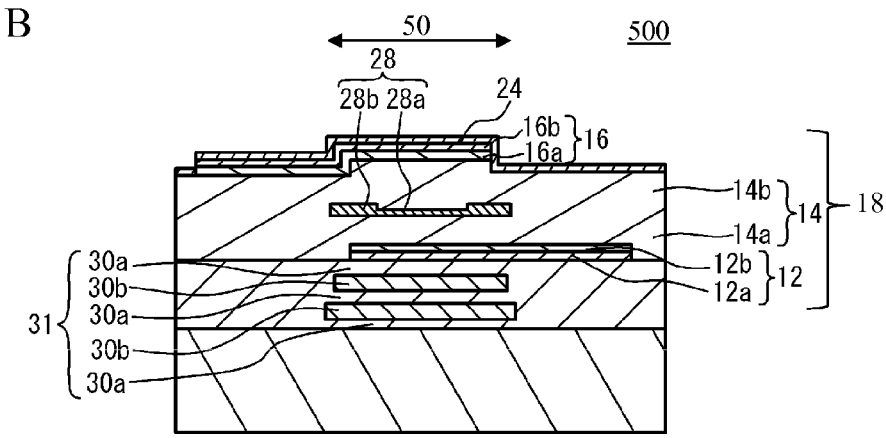
FIG. 11B is a cross-section diagram of the piezoelectric thin film resonator according to a variation example of the third embodiment.

A third embodiment is an example in which the configuration of the space is changed. FIG. 11A is a cross-section diagram of a piezoelectric thin film resonator 400 according to the third embodiment. FIG. 11B is a cross-section diagram of a piezoelectric thin film resonator 500 according to a variation example of the third embodiment. As illustrated in FIG. 11A, the multilayered film 18 in the resonance region 50 is not domy but flat. A cavity is formed on an upper surface of the substrate 10. The lower electrode 12 is formed flatly on the substrate 10. Thereby, the space 30 is formed in the cavity of the substrate 10. The space 30 is formed so as to include the resonance region 50. Since the other configuration is the same as corresponding configuration of the first embodiment, a description thereof is omitted. The space 30 may be formed so as to penetrate the substrate 10. Here, an insulating film may be formed so as to contact a lower surface of the lower electrode 12. That is, the space 30 may be formed between the substrate 10 and the insulating film contacting the lower electrode 12. For example, an AlN film can be used as the insulating film.

As illustrated in FIG. 11B, the multilayered film 18 in the resonance region 50 is not domy but flat. An acoustic mirror 31 is formed on a side opposite to the piezoelectric film 14 of the lower electrode 12 in the resonance region 50. Films 30a having a low acoustic impedance and films 30b having a low acoustic impedance are alternately provided in the acoustic mirror 31. Each of the film thicknesses of the films 30a and the films 30b is λ/4 (λ is a wavelength of the acoustic wave). The laminating number of films 30a and films 30b can be set arbitrarily. Since the other configuration is the same as corresponding configuration of the first embodiment, a description thereof is omitted.

Here, in the third embodiment and the variation example thereof, the insertion film 28 may be provided outside the resonance region 50, as with the second embodiment. Moreover, the insertion film 28 does not have to be provided outside the resonance region 50.

As indicated in the first to the third embodiments, the piezoelectric thin film resonator may be a FBAR (Film Bulk Acoustic Resonator) including in the resonance region 50 the space 30 formed between the substrate 10 and the lower electrode 12. Moreover, as indicated in the variation example of the third embodiment, the piezoelectric thin film resonator may be a SMR (Solidly Mounted Resonator) including in the resonance region 50 the acoustic mirror 31 that reflects the acoustic wave propagating through the piezoelectric film 14 and is arranged under the lower electrode 12.

Although each of the first to the third embodiments and the variation example of the third embodiment explains an example in which the resonance region 50 has an ellipse shape, the resonance region 50 may have other shape. For example, the resonance region 50 may be a polygon, such as a quadrangle or a pentagon.

Fourth Embodiment

Figure 12:
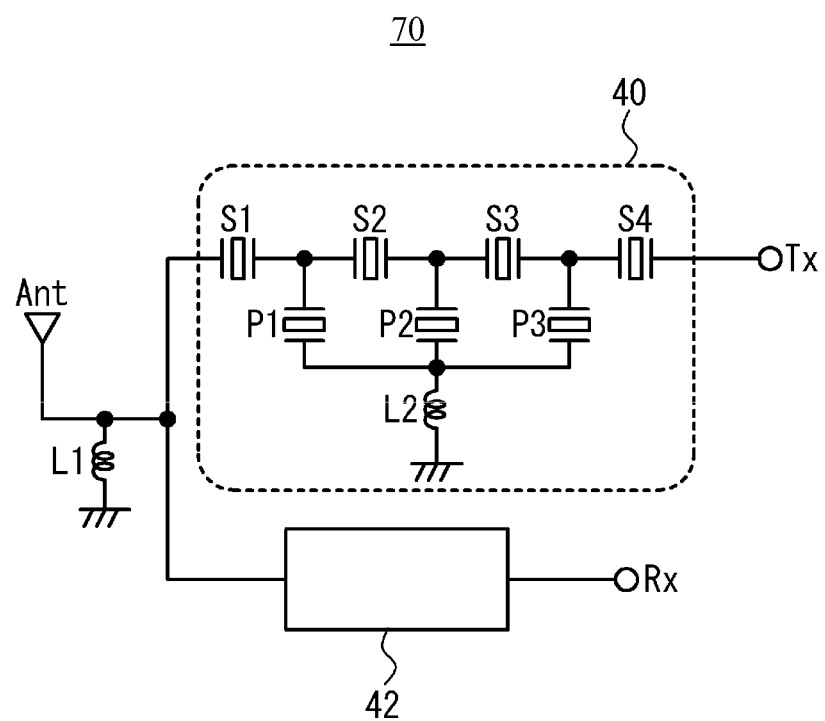
FIG. 12 is a circuit diagram of a duplexer according to a fourth embodiment.

A fourth embodiment indicates an example of a duplexer 70. FIG. 12 is a circuit diagram of the duplexer 70 according to the fourth embodiment. As illustrated in FIG. 12, the duplexer 70 includes a transmitting filter 40 and a receiving filter 42. The transmitting filter 40 is connected between a common terminal Ant and a transmission terminal Tx. The receiving filter 42 is connected between the common terminal Ant and a reception terminal Tx. An inductor L1 as a matching circuit is provided between the common terminal Ant and a ground. The transmitting filter 40 passes a signal of a transmission band among signals inputted from the transmission terminal Tx to the common terminal Ant as a transmission signal, and suppresses signals having other frequencies. The receiving filter 42 passes a signal of a reception band among signals inputted from the common terminal Ant to the reception terminal Rx as a reception signal, and suppresses signals having other frequencies. The inductor L1 matches impedances so that the transmission signal which has passed through the transmitting filter 40 does not leak out to the receiving filter 42 and is outputted from the common termination Ant.

The transmitting filter 40 is a ladder type filter. One or more series resonators S1 to S4 are connected in series between the transmission terminal Tx (an input terminal) and the common terminal Ant (an output terminal). One or more parallel resonators P1 to P3 are connected in parallel between the transmission terminal Tx and the common terminal Ant. The number of series resonators, the number of parallel resonators and the number of inductors, and their connection can be changed properly to get desired characteristics of the transmitting filter. The piezoelectric thin film resonators of the first to the third embodiments and the variation example can be used as at least one of the series resonators S1 to S4 and the parallel resonators P1 to P3.

Figure 13A:
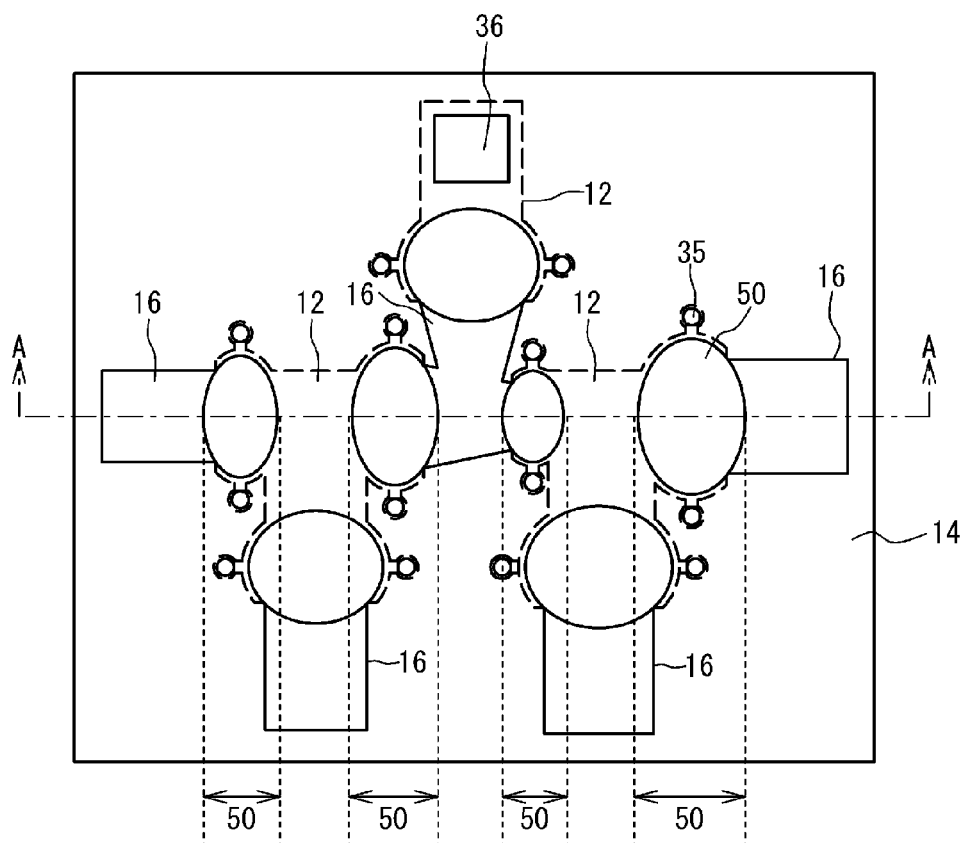
FIG. 13A is a plain view of a transmission filter.
Figure 13B:
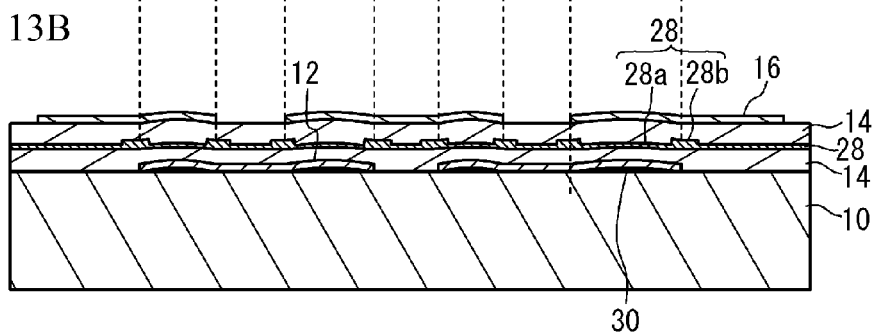
FIG. 13B is a cross-section diagram taken along a line A-A of FIG. 13A.
Figure 14:
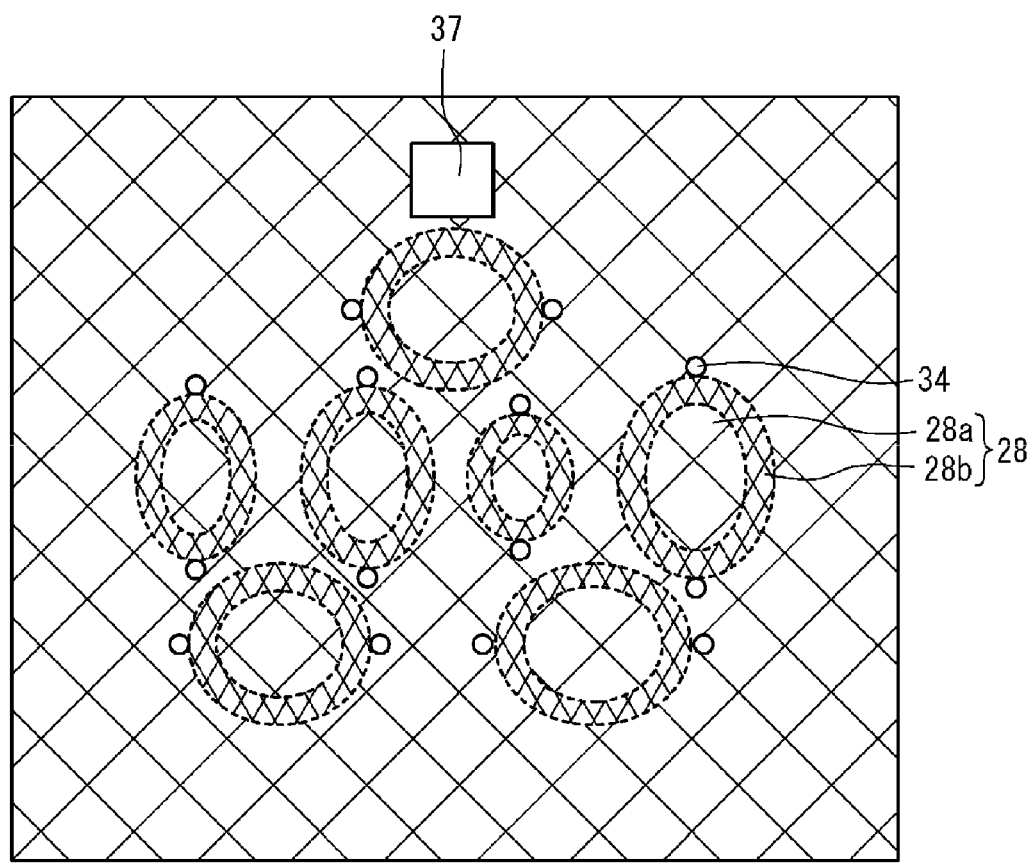
FIG. 14 is a plain view of an insertion film in the transmission filter.

FIG. 13A is a plain view of the transmission filter. FIG. 13B is a cross-section diagram taken along a line A-A of FIG. 13A. FIG. 14 is a plain view of the insertion film. As illustrated in FIGS. 13A, 13B and 14, a plurality of piezoelectric thin film resonators according to the second embodiment are formed on the same substrate 10, thereby forming the ladder type filter. An opening 36 is formed on the piezoelectric film 14 (i.e. the upper piezoelectric film and the lower the piezoelectric film), and an opening 37 is formed on the insertion film 28. The lower electrode 12 can be electrically connected to the outside via the openings 36 and 37. In the central region 54 of the resonance region 50, the thin film part 28a is formed as the insertion film 28. In the outer circumference region 52, the thick film part 28b is formed as the insertion film 28. Since the other configuration is the same as corresponding configuration of the second embodiment, a description thereof is omitted. The size and the shape of the resonance region 50 about each of the resonators S1 to S4 and P1 to P3 can be changed properly.

The receiving filter 42 may be the ladder type filter or a multiplex mode filter. At least one of the transmitting filter 40 and the receiving filter 42 can be the ladder type filter or a lattice type filter. At least one of the resonators in at least one of the transmitting filter 40 and the receiving filter 42 can be the piezoelectric thin film resonator according to the first to the third embodiments and the variation example of the third embodiment.

A filter includes the piezoelectric thin film resonator according to the first to the third embodiments and the variation example of the third embodiment. Thereby, the temperature change of the resonance characteristic of the resonator can be controlled, and the temperature change of the frequency characteristic about the pass band or the like of the filter can be controlled. Moreover, the Q-value of the resonator can be improved, and the skirt characteristic of the filter can be improved.

Moreover, at least one of the transmitting filter 40 and the receiving filter 42 can be the filter including the piezoelectric thin film resonator according to the first to the third embodiments and the variation example of the third embodiment.

Although the embodiments of the present invention have been described in detail, it is to be understood that the various changes, substitutions, and alterations could be made hereto without departing from the spirit and scope of the invention.

What is claimed is:
1. A piezoelectric thin film resonator comprising:
a substrate;
a piezoelectric film provided on the substrate;
a lower electrode and an upper electrode that are opposed to each other to put at least a part of the piezoelectric film therebetween; and
an insertion film that is inserted into the piezoelectric film in a resonance region that is defined by said at least part of the piezoelectric film put between the lower electrode and the upper electrode, said insertion film having a thin film part and a thick film part that is relatively thicker than the thin film part, a planar shape of the thick film part in the resonance region being a ring shape along an outer circumference of the resonance region, or a shape in which a part of such a ring shape is cut.

2. The piezoelectric thin film resonator according to claim 1, wherein
a temperature coefficient of an elastic constant of the insertion film inside the central region has a code reverse to a code of a temperature coefficient of an elastic constant of the piezoelectric film.

3. The piezoelectric thin film resonator according to claim 1, wherein
the insertion film includes a film having a Young's modulus smaller than a Young's modulus of the piezoelectric film.

4. The piezoelectric thin film resonator according to claim 1, wherein
the insertion film is mainly composed of silicon oxide.

5. The piezoelectric thin film resonator according to claim 1, wherein
the piezoelectric film is mainly composed of aluminum nitride.

6. The piezoelectric thin film resonator according to claim 1, wherein
in the resonance region, a space is formed between the substrate and one of the lower electrode and an insulating film contacting the lower electrode.

7. The piezoelectric thin film resonator according to claim 1, further comprising:
in the resonance region, an acoustic mirror that reflects an acoustic wave propagating through the piezoelectric film and is arranged opposite to the piezoelectric film with respect to the lower electrode.

8. A filter comprising:
a piezoelectric thin film resonator according to claim 1.

9. A duplexer comprising:
a transmitting filter; and
a receiving filter;
wherein at least one of the transmitting filter and the receiving filter is the filter according to claim 8.

10. The piezoelectric thin film resonator according to claim 1, wherein a width of the thick film part of the insertion film in the resonance region is 2.5 times or less a wavelength of an acoustic wave of a thickness longitudinal vibration of the piezoelectric thin film resonator, and is 0.3 times or more said wavelength.

* * * * *